(12) United States Patent
Khlat

(10) Patent No.: US 11,108,359 B2
(45) Date of Patent: *Aug. 31, 2021

(54) MULTI-AMPLIFIER ENVELOPE TRACKING CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/263,368

(22) Filed: Jan. 31, 2019

(65) Prior Publication Data
US 2020/0127609 A1 Apr. 23, 2020

Related U.S. Application Data

(60) Provisional application No. 62/748,084, filed on Oct. 19, 2018.

(51) Int. Cl.
*H03F 1/02* (2006.01)
*H03F 3/24* (2006.01)
(Continued)

(52) U.S. Cl.
CPC ......... *H03F 1/0227* (2013.01); *H03F 1/0277* (2013.01); *H03F 3/189* (2013.01);
(Continued)

(58) Field of Classification Search
CPC ........ H03F 1/0227; H03F 3/24; H03F 3/3042; H03F 3/189; H03F 1/0277;
(Continued)

(56) References Cited

U.S. PATENT DOCUMENTS 6,529,716 B1  3/2003 Eidson et al.
6,788,151 B2  9/2004 Shvarts et al.
(Continued)

OTHER PUBLICATIONS

Non-Final Office Action for U.S. Appl. No. 16/263,316, dated Dec. 23, 2019, 9 pages.
(Continued)

*Primary Examiner* — Hieu P Nguyen
(74) *Attorney, Agent, or Firm* — Withrow & Terranova, PLLC

(57) ABSTRACT

A multi-amplifier envelope tracking (ET) circuit and related apparatus are provided. The multi-amplifier ET circuit includes a number of amplifier circuits configured to amplify concurrently a radio frequency (RF) signal to generate a number of amplified RF signals for concurrent transmission, for example, in a millimeter wave (mmWave) spectrum. The amplifier circuits are configured to amplify the RF signal based on a number of ET voltages and a number of low-frequency currents, respectively. A number of driver circuits is provided in the multi-amplifier ET circuit to generate the ET voltages and the low-frequency currents for the amplifier circuits, respectively. In examples discussed herein, the driver circuits are co-located with the amplifier circuits to help improve efficiency and maintain linearity in the amplifier circuits, particularly when the RF signal is modulated at a higher modulation bandwidth (e.g., >80 MHz).

20 Claims, 4 Drawing Sheets

(51) Int. Cl.
  *H03F 3/30* (2006.01)
  *H03F 3/189* (2006.01)
  *H04B 1/04* (2006.01)

(52) U.S. Cl.
  CPC .............. *H03F 3/24* (2013.01); *H03F 3/3042* (2013.01); *H04B 1/0483* (2013.01)

(58) Field of Classification Search
  CPC ......... H03F 2200/516; H03F 2200/511; H03F 2200/411; H03F 3/68; H03F 2200/102; H04B 1/0483; H04B 1/0475
  USPC ........... 330/124 R, 295, 136, 53–54, 84, 286
  See application file for complete search history.

(56) References Cited

U.S. PATENT DOCUMENTS

| | | | |
|---|---|---|---|
| 8,019,289 B2 | 9/2011 | Gorbachov | |
| 8,290,453 B2 | 10/2012 | Yoshihara | |
| 8,385,859 B2 | 2/2013 | Hamano | |
| 8,476,976 B2* | 7/2013 | Wimpenny | H03F 3/45076 330/127 |
| 8,598,950 B2 | 12/2013 | Khesbak | |
| 8,600,321 B2 | 12/2013 | Nambu et al. | |
| 8,611,402 B2 | 12/2013 | Chiron | |
| 8,665,016 B2 | 3/2014 | Chowdhury et al. | |
| 8,665,931 B2 | 3/2014 | Afsahi et al. | |
| 8,803,603 B2* | 8/2014 | Wimpenny | H03F 1/0222 330/124 R |
| 8,816,272 B1 | 8/2014 | Brown et al. | |
| 8,818,305 B1 | 8/2014 | Schwent et al. | |
| 8,921,774 B1 | 12/2014 | Brown et al. | |
| 8,942,651 B2 | 1/2015 | Jones | |
| 8,989,682 B2 | 3/2015 | Ripley et al. | |
| 9,002,303 B2 | 4/2015 | Brobston | |
| 9,065,509 B1 | 6/2015 | Yan et al. | |
| 9,197,162 B2 | 11/2015 | Chiron et al. | |
| 9,197,256 B2 | 11/2015 | Khlat | |
| 9,246,460 B2 | 1/2016 | Khlat et al. | |
| 9,247,496 B2 | 1/2016 | Khlat | |
| 9,270,230 B2 | 2/2016 | Henshaw et al. | |
| 9,287,829 B2 | 3/2016 | Nobbe et al. | |
| 9,288,098 B2 | 3/2016 | Yan et al. | |
| 9,294,043 B2 | 3/2016 | Ripley et al. | |
| 9,379,667 B2 | 6/2016 | Khlat et al. | |
| 9,438,172 B2 | 9/2016 | Cohen | |
| 9,515,621 B2 | 12/2016 | Hietala et al. | |
| 9,515,622 B2 | 12/2016 | Nentwig et al. | |
| 9,516,693 B2 | 12/2016 | Khlat et al. | |
| 9,571,152 B2 | 2/2017 | Ripley et al. | |
| 9,596,110 B2 | 3/2017 | Jiang et al. | |
| 9,614,476 B2 | 4/2017 | Khlat | |
| 9,614,477 B1* | 4/2017 | Rozenblit | H03F 1/0227 |
| 9,641,206 B2 | 5/2017 | Pratt et al. | |
| 9,671,801 B2 | 6/2017 | Bhattad et al. | |
| 9,743,357 B2 | 8/2017 | Tabe | |
| 9,831,834 B2* | 11/2017 | Balteanu | H03F 1/0227 |
| 9,843,294 B2 | 12/2017 | Khlat | |
| 9,859,845 B2 | 1/2018 | Sarbishaei et al. | |
| 9,912,296 B1 | 3/2018 | Cheng et al. | |
| 9,912,297 B2 | 3/2018 | Khlat | |
| 9,912,301 B2 | 3/2018 | Xue et al. | |
| 9,941,844 B2 | 4/2018 | Khlat | |
| 9,948,240 B2 | 4/2018 | Khlat et al. | |
| 9,954,436 B2 | 4/2018 | Khlat | |
| 9,960,737 B1 | 5/2018 | Kovac | |
| 9,974,050 B2 | 5/2018 | Wiser et al. | |
| 9,991,851 B1 | 6/2018 | Dinur et al. | |
| 9,991,856 B2* | 6/2018 | Khesbak | H03F 3/24 |
| 9,991,913 B1 | 6/2018 | Dinur et al. | |
| 10,003,303 B2 | 6/2018 | Afsahi et al. | |
| 10,069,470 B2 | 9/2018 | Khlat et al. | |
| 10,090,809 B1 | 10/2018 | Khlat | |
| 10,097,387 B1 | 10/2018 | Wiser et al. | |
| 10,103,926 B1 | 10/2018 | Khlat | |
| 10,110,169 B2 | 10/2018 | Khesbak et al. | |
| 10,141,891 B2 | 11/2018 | Gomez et al. | |
| 10,158,330 B1 | 12/2018 | Khlat | |
| 10,171,037 B2 | 1/2019 | Khlat | |
| 10,171,038 B1 | 1/2019 | Chen et al. | |
| 10,181,826 B2 | 1/2019 | Khlat et al. | |
| 10,204,775 B2 | 2/2019 | Brown et al. | |
| 10,305,429 B2 | 5/2019 | Choo et al. | |
| 10,326,408 B2 | 6/2019 | Khlat et al. | |
| 10,355,646 B2 | 7/2019 | Lee et al. | |
| 10,361,660 B2 | 7/2019 | Khlat | |
| 10,382,147 B2 | 8/2019 | Ripley et al. | |
| 10,396,716 B2 | 8/2019 | Afsahi et al. | |
| 10,419,255 B2 | 9/2019 | Wiser et al. | |
| 10,432,145 B2 | 10/2019 | Khlat | |
| 10,439,789 B2 | 10/2019 | Brunel et al. | |
| 10,454,428 B2 | 10/2019 | Khesbak et al. | |
| 10,476,437 B2 | 11/2019 | Nag et al. | |
| 2004/0100323 A1 | 5/2004 | Khanifer et al. | |
| 2009/0253389 A1 | 10/2009 | Ma et al. | |
| 2011/0223875 A1 | 9/2011 | Hamano | |
| 2012/0142304 A1 | 6/2012 | Degani et al. | |
| 2012/0146731 A1 | 6/2012 | Khesbak | |
| 2012/0194274 A1 | 8/2012 | Fowers et al. | |
| 2012/0302179 A1 | 11/2012 | Brobston | |
| 2012/0309333 A1 | 12/2012 | Nambu et al. | |
| 2013/0141159 A1 | 6/2013 | Strange et al. | |
| 2013/0207731 A1 | 8/2013 | Balteanu | |
| 2013/0285750 A1 | 10/2013 | Chowdhury et al. | |
| 2014/0111279 A1 | 4/2014 | Brobston | |
| 2014/0218109 A1 | 8/2014 | Wimpenny | |
| 2014/0306763 A1 | 10/2014 | Hong et al. | |
| 2014/0361837 A1 | 12/2014 | Strange et al. | |
| 2015/0009980 A1 | 1/2015 | Modi et al. | |
| 2015/0091645 A1 | 4/2015 | Park et al. | |
| 2015/0123628 A1 | 5/2015 | Bhattad et al. | |
| 2015/0194988 A1 | 7/2015 | Yan et al. | |
| 2015/0236729 A1 | 8/2015 | Peng et al. | |
| 2016/0036389 A1 | 2/2016 | Balteanu et al. | |
| 2016/0050629 A1 | 2/2016 | Khesbak et al. | |
| 2016/0094185 A1 | 3/2016 | Shute | |
| 2016/0094186 A1 | 3/2016 | Cohen | |
| 2016/0105151 A1 | 4/2016 | Langer | |
| 2016/0181995 A1 | 6/2016 | Nentwig et al. | |
| 2016/0204809 A1 | 7/2016 | Pratt et al. | |
| 2016/0226448 A1 | 8/2016 | Wimpenny | |
| 2016/0294587 A1 | 10/2016 | Jiang et al. | |
| 2017/0070199 A1 | 3/2017 | Anderson et al. | |
| 2017/0077877 A1 | 3/2017 | Anderson | |
| 2017/0093340 A1 | 3/2017 | Khesbak | |
| 2017/0207802 A1 | 7/2017 | Pratt et al. | |
| 2017/0230924 A1 | 8/2017 | Wolberg et al. | |
| 2017/0279412 A1 | 9/2017 | Afsahi et al. | |
| 2017/0353287 A1 | 12/2017 | Onaka et al. | |
| 2018/0048276 A1 | 2/2018 | Khlat et al. | |
| 2018/0138862 A1 | 5/2018 | Balteanu et al. | |
| 2018/0138863 A1 | 5/2018 | Khlat | |
| 2018/0159476 A1 | 6/2018 | Balteanu et al. | |
| 2018/0159566 A1 | 6/2018 | Dinur et al. | |
| 2018/0287564 A1 | 10/2018 | Afsahi et al. | |
| 2018/0309409 A1 | 10/2018 | Khlat | |
| 2018/0309414 A1 | 10/2018 | Khlat et al. | |
| 2018/0316440 A1 | 11/2018 | Mita | |
| 2018/0358930 A1 | 12/2018 | Haine | |
| 2019/0036493 A1 | 1/2019 | Khlat et al. | |
| 2019/0044480 A1 | 2/2019 | Khlat | |
| 2019/0089310 A1 | 3/2019 | Khlat et al. | |
| 2019/0109566 A1 | 4/2019 | Folkmann et al. | |
| 2019/0109613 A1 | 4/2019 | Khlat et al. | |
| 2019/0181804 A1 | 6/2019 | Khlat | |
| 2019/0222176 A1 | 7/2019 | Khlat | |
| 2019/0222181 A1 | 7/2019 | Khlat | |
| 2019/0267947 A1 | 8/2019 | Khlat et al. | |
| 2019/0356285 A1 | 11/2019 | Khlat et al. | |

(56) References Cited

U.S. PATENT DOCUMENTS

2020/0136575 A1     4/2020    Khlat et al.
2020/0350878 A1     11/2020   Drogi et al.

OTHER PUBLICATIONS

Notice of Allowance for U.S. Appl. No. 16/273,288, dated Dec. 13, 2019, 8 pages.
Notice of Allowance for U.S. Appl. No. 16/193,513, dated Mar. 25, 2020, 8 pages.
Non-Final Office Action for U.S. Appl. No. 16/250,229, dated Apr. 29, 2020, 7 pages.
Non-Final Office Action for U.S. Appl. No. 16/267,740, dated Apr. 30, 2020, 10 pages.
Final Office Action for U.S. Appl. No. 16/263,316, dated May 13, 2020, 10 pages.
Notice of Allowance for U.S. Appl. No. 16/270,119, dated Jun. 18, 2020, 9 pages.
Notice of Allowance for U.S. Appl. No. 16/250,229, dated Sep. 22, 2020, 7 pages.
Non-Final Office Action for U.S. Appl. No. 16/263,316, dated Jul. 17, 2020, 4 pages.
Notice of Allowance for U.S. Appl. No. 16/278,886, dated Sep. 22, 2020, 8 pages.
Non-Final Office Action for U.S. Appl. No. 16/250,298, dated Aug. 20, 2020, 8 pages.
Quayle Action for U.S. Appl. No. 16/267,740, dated Oct. 19, 2020, 7 pages.
Non-Final Office Action for U.S. Appl. No. 16/263,316, dated Nov. 24, 2020, 4 pages.
Notice of Allowance for U.S. Appl. No. 16/508,704, dated Dec. 30, 2020, 7 pages.
Notice of Allowance for U.S. Appl. No. 16/508,768, dated Oct. 27, 2020, 9 pages.
Quayle Action for U.S. Appl. No. 16/514,339, dated Nov. 19, 2020, 9 pages.
U.S. Appl. No. 16/193,513, filed Nov. 16, 2018.
U.S. Appl. No. 16/250,229, filed Jan. 17, 2019.
U.S. Appl. No. 16/267,740, filed Feb. 5, 2019.
U.S. Appl. No. 16/263,316, filed Jan. 31, 2019.
U.S. Appl. No. 16/270,119, filed Feb. 7, 2019.
U.S. Appl. No. 16/273,288, filed Feb. 12, 2019.
U.S. Appl. No. 16/278,886, filed Feb. 19, 2019.
U.S. Appl. No. 16/250,298, filed Jan. 17, 2019.
U.S. Appl. No. 16/267,779, filed Feb. 5, 2019.
Notice of Allowance for U.S. Appl. No. 16/267,740, dated Mar. 3, 2021, 8 pages.
Notice of Allowance for U.S. Appl. No. 16/263,316, dated Mar. 30, 2021, 7 pages.
Quayle Action for U.S. Appl. No. 16/250,298, dated Feb. 3, 2021, 5 pages.
Notice of Allowance for U.S. Appl. No. 16/250,298, dated Apr. 15, 2021, 8 pages.
Non-Final Office Action for U.S. Appl. No. 16/689,236, dated Mar. 2, 2021, 15 pages.
Non-Final Office Action for U.S. Appl. No. 16/660,900, dated Feb. 18, 2021, 7 pages.
Notice of Allowance for U.S. Appl. No. 16/689,417, dated Feb. 24, 2021, 7 pages.
Notice of Allowance for U.S. Appl. No. 16/689,236, dated Jun. 9, 2021, 7 pages.
Non-Final Office Action for U.S. Appl. No. 16/669,728, dated Jun. 3, 2021, 9 pages.

* cited by examiner

MULTI-AMPLIFIER ENVELOPE TRACKING CIRCUIT AND RELATED APPARATUS

RELATED APPLICATION

This application claims the benefit of U.S. provisional patent application No. 62/748,084, filed on Oct. 19, 2018, the disclosure of which is incorporated herein by reference in its entirety.

This application is related to U.S. patent application Ser. No. 16/263,316, filed Jan. 31, 2019, now published as U.S. patent application publication no. 2020/0127608 A1, entitled "MULTI-AMPLIFIER ENVELOPE TRACKING CIRCUIT AND RELATED APPARATUS," the disclosure of which is hereby incorporated herein by reference in its entirety.

FIELD OF THE DISCLOSURE

The technology of the disclosure relates generally to an envelope tracking (ET) amplifier apparatus in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of power amplifiers to help reduce power consumption and thermal dissipation in a mobile communication device. In an ET system, an ET power amplifier(s) amplifies an RF signal(s) based on time-variant voltages generated in accordance to time-variant amplitudes of the RF signal(s). The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signal(s). Notably, the better the time-variant voltage envelope tracks the time-variant power envelope, the higher efficiency can be achieved in the ET power amplifier(s). In this regard, it may be necessary for the ET system to constantly adjust the time-variant voltages applied to the ET power amplifier(s) to ensure that the ET power amplifier(s) can consistently operate at a desired efficiency for any given instantaneous power requirement of the RF signal(s).

SUMMARY

Aspects disclosed in the detailed description include a multi-amplifier envelope tracking (ET) circuit and related apparatus. The multi-amplifier ET circuit includes a number of amplifier circuits configured to amplify concurrently a radio frequency (RF) signal to generate a number of amplified RF signals for concurrent transmission, for example, in a millimeter wave (mmWave) spectrum. The amplifier circuits are configured to amplify the RF signal based on a number of ET voltages and a number of low-frequency currents, respectively. A number of driver circuits are provided in the multi-amplifier ET circuit to generate the ET voltages and the low-frequency currents for the amplifier circuits, respectively. In examples discussed herein, the driver circuits are co-located with the amplifier circuits to help improve efficiency and maintain linearity in the amplifier circuits, particularly when the RF signal is modulated at a higher modulation bandwidth (e.g., >80 MHz).

In one aspect, a multi-amplifier ET circuit is provided. The multi-amplifier ET circuit includes a number of amplifier circuits configured to amplify concurrently an RF signal based on a number of ET voltages and a number of low-frequency currents, respectively. The multi-amplifier ET circuit also includes a common port configured to receive a common low-frequency current. The multi-amplifier ET circuit also includes a number of driver circuits coupled in parallel between the common port and the amplifier circuits. The driver circuits are configured to receive the common low-frequency current from the common port. The driver circuits are also configured to receive a number of ET target voltages, respectively. The driver circuits are also configured to generate the ET voltages based on the ET target voltages, respectively. The driver circuits are also configured to generate the low-frequency currents, respectively, based on the common low-frequency current.

In another aspect, an ET amplifier apparatus is provided. The ET amplifier apparatus includes a multi-amplifier ET circuit. The multi-amplifier ET circuit includes a number of amplifier circuits configured to amplify concurrently an RF signal based on a number of ET voltages and a number of low-frequency currents, respectively. The multi-amplifier ET circuit also includes a common port configured to receive a common low-frequency current. The multi-amplifier ET circuit also includes a number of driver circuits coupled in parallel between the common port and the amplifier circuits. The driver circuits are configured to receive the common low-frequency current from the common port. The driver circuits are also configured to receive a number of ET target voltages, respectively. The driver circuits are also configured to generate the ET voltages based on the ET target voltages, respectively. The driver circuits are also configured to generate the low-frequency currents, respectively, based on the common low-frequency current. The ET amplifier apparatus also includes an ET tracker circuit configured to provide the common low-frequency current to the common port.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
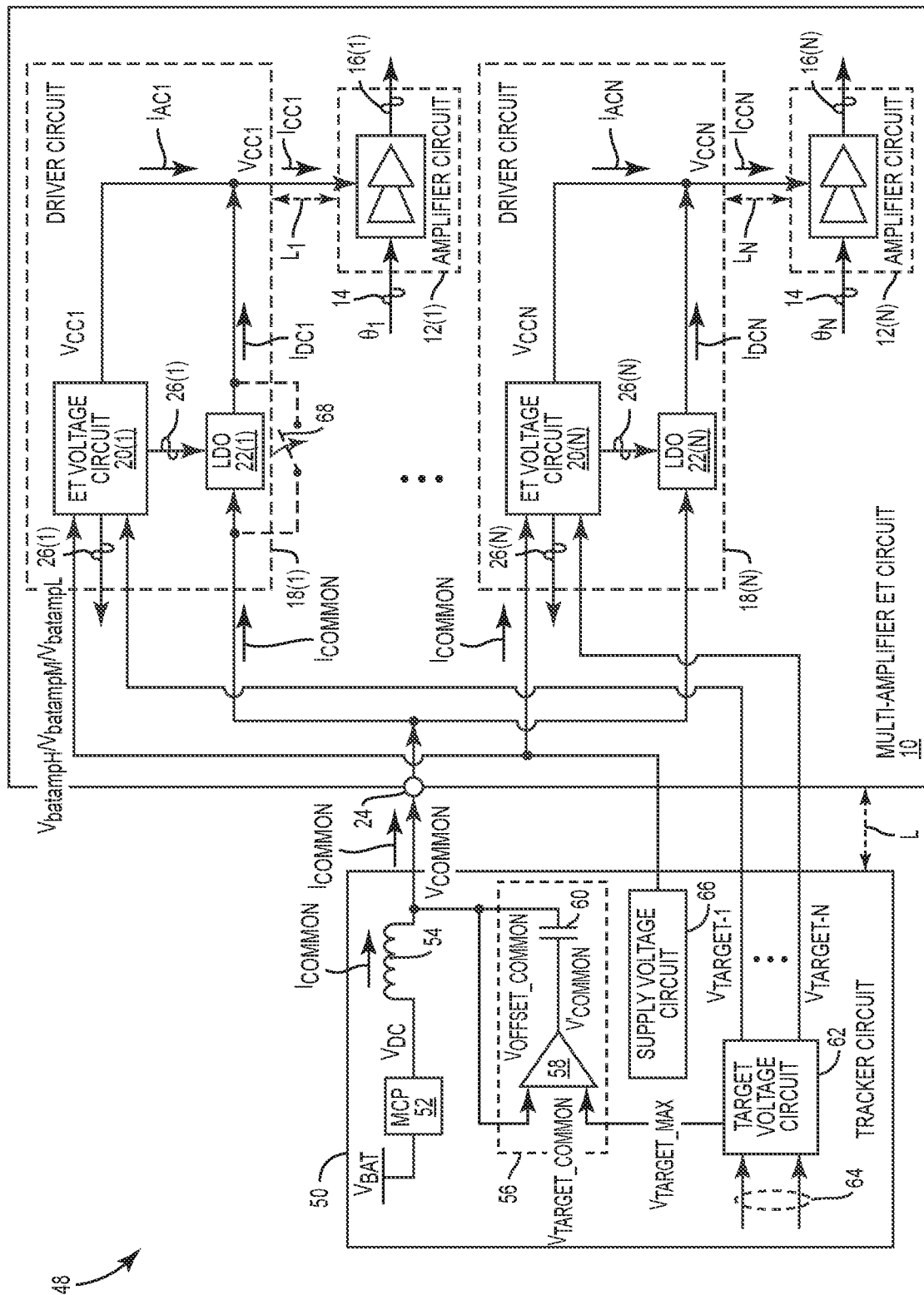
FIG. 1 is a schematic diagram of an exemplary multi-amplifier envelope tracking (ET) circuit including a number of amplifier circuits configured to amplify concurrently a radio frequency (RF) signal to generate a number of amplified RF signals, respectively.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a multi-amplifier envelope tracking (ET) circuit and related apparatus. The multi-amplifier ET circuit includes a number of amplifier circuits configured to amplify concurrently a radio frequency (RF) signal to generate a number of amplified RF signals for concurrent transmission, for example, in a millimeter wave (mmWave) spectrum. The amplifier circuits are configured to amplify the RF signal based on a number of ET voltages and a number of low-frequency currents, respectively. A number of driver circuits are provided in the multi-amplifier ET circuit to generate the ET voltages and the low-frequency currents for the amplifier circuits, respectively. In examples discussed herein, the driver circuits are co-located with the amplifier circuits to help improve efficiency and maintain linearity in the amplifier circuits, particularly when the RF signal is modulated at a higher modulation bandwidth (e.g., >80 MHz).

In this regard, FIG. 1 is a schematic diagram of an exemplary multi-amplifier ET circuit 10 including a plurality of amplifier circuits 12(1)-12(N) configured to amplify concurrently an RF signal 14 to generate a plurality of amplified RF signals 16(1)-16(N), respectively. In a non-limiting example, the RF signal 14 can be a fifth-generation new-radio (5G-NR) communication signal configured to be transmitted in a millimeter wave (mmWave) spectrum (e.g., >28 GHz). In this regard, the multi-amplifier ET circuit 10 may be coupled to an antenna array (not shown) configured to radiate concurrently the amplified RF signals 16(1)-16(N) in a formed RF beam(s) to a receiving device (not shown).

The amplifier circuits 12(1)-12(N) are configured to amplify the RF signal 14 based on a plurality of ET voltages $V_{CC1}$-$V_{CCN}$. Notably, the amplified RF signals 16(1)-16(N) may arrive at the receiving device via different propagation paths. As a result, the amplified RF signals 16(1)-16(N) received by the receiving device may experience different propagation delays and/or propagation attenuations. To ensure that the amplified RF signals 16(1)-16(N) can be coherently combined (e.g., linearly combined) at the receiving device, the RF signal 14 may be pre-processed (e.g., phase shifted) prior to being amplified by the amplifier circuits 12(1)-12(N). In this regard, the RF signal 14 being amplified by the amplifier circuits 12(1)-12(N) may be associated with different phases $\theta_1$-$\theta_N$ configured to accommodate for the propagation delays of the amplified RF signals 16(1)-16(N), respectively. In one non-limiting example, the amplifier circuits 12(1)-12(N) may be configured to amplify the RF signal 14 to different power levels to compensate for the propagation attenuations of the amplified RF signals 16(1)-16(N). In this regard, the amplified RF signals 16(1)-16(N) may correspond to different time-variant power envelopes having different peak-to-average ratios (PARs). Accordingly, the ET voltages $V_{CC1}$-$V_{CCN}$ received by the amplifier circuits 12(1)-12(N) may be generated in accordance to the different power levels. In another non-limiting example, the amplifier circuits 12(1)-12(N) may be configured to amplify the RF signal 14 to an identical power level. However, given that the amplifier circuits 12(1)-12(N) may correspond to different impedances, the ET voltages $V_{CC1}$-$V_{CCN}$ received by the amplifier circuits 12(1)-12(N) may be generated in accordance to the different impedances.

The amplifier circuits 12(1)-12(N) are also configured to amplify the RF signal 14 based on a plurality of currents $I_{CC1}$-$I_{CCN}$, respectively. Each of the currents $I_{CC1}$-$I_{CCN}$ may include a low-frequency current (e.g., a direct current) and a high-frequency current (e.g., an alternating current). In this regard, the currents $I_{CC1}$-$I_{CCN}$ may include a plurality of low-frequency currents $I_{DC1}$-$I_{DCN}$ and a plurality of high-frequency currents $I_{AC1}$-$I_{ACN}$, respectively ($I_{CCX}$=$I_{DCX}$+$I_{ACX}$, 1≤X≤N).

The multi-amplifier ET circuit 10 includes a plurality of driver circuits 18(1)-18(N) configured to generate the ET voltages $V_{CC1}$-$V_{CCN}$ and the currents $I_{CC1}$-$I_{CCN}$ for the amplifier circuits 12(1)-12(N), respectively. The driver circuits 18(1)-18(N) are coupled to the amplifier circuits 12(1)-12(N) over a number of conductive lengths $L_1$-$L_N$, respectively. In a non-limiting example, each of the conductive lengths $L_1$-$L_N$ corresponds to a respective trace inductance that is less than four-tenths (0.4) nanoHenry (nH). Accordingly, the driver circuits 18(1)-18(N) are said to be co-located with the amplifier circuits 12(1)-12(N) in the multi-amplifier ET circuit 10. The driver circuits 18(1)-18(N) and the amplifier circuits 12(1)-12(N) may be integrated into a single semiconductor die. Alternatively, it may also be possible to provide the driver circuits 18(1)-18(N) and the amplifier circuits 12(1)-12(N) in different semiconductor dies (e.g., a first semiconductor die and a second semiconductor die). By co-locating the driver circuits 18(1)-18(N) with the amplifier circuits 12(1)-12(N) in the multi-amplifier ET circuit 10, it may be possible to reduce the respective trace inductance associated with each of the conductive lengths $L_1$-$L_N$. As a result, it may be possible to reduce trace inductance-related distortions to the ET voltages $V_{CC1}$-$V_{CCN}$ and/or the high-frequency currents $I_{AC1}$-$I_{ACN}$, thus helping to improve efficiency and linearity in the amplifier circuits 12(1)-12(N), regardless of a corresponding modulation bandwidth of the RF signal 14.

The driver circuits 18(1)-18(N) include a plurality of ET voltage circuits 20(1)-20(N) and a plurality of regulator circuits 22(1)-22(N) (denoted as "LDO"), respectively. The ET voltage circuits 20(1)-20(N) are coupled to the amplifier circuits 12(1)-12(N) and configured to generate the ET voltages $V_{CC1}$-$V_{CCN}$ for the amplifier circuits 12(1)-12(N), respectively. To ensure that the amplifier circuits 12(1)-12(N) can generate the amplified RF signals 16(1)-16(N) in accordance to the different time-variant power envelopes, the ET voltage circuits 20(1)-20(N) may be configured to generate the ET voltages $V_{CC1}$-$V_{CCN}$ in accordance to the time-variant power envelopes of the amplified RF signals 16(1)-16(N). As such, the ET voltage circuits 20(1)-20(N) may be configured to generate the ET voltages $V_{CC1}$-$V_{CCN}$ based on a plurality of ET target voltages $V_{TARGET-1}$-$V_{TARGET-N}$, respectively. The ET target voltages $V_{TARGET-1}$-$V_{TARGET-N}$ can be configured to have a plurality of time-variant target voltage envelopes that track the time-variant power envelopes of the amplified RF signals 16(1)- 16(N), respectively. In this regard, the time-variant target voltage envelopes may rise and fall in accordance to the rises and falls of the time-variant power envelopes of the amplified RF signals 16(1)-16(N). Accordingly, the ET voltage circuits 20(1)-20(N) may generate the ET voltages $V_{CC1}$-$V_{CCN}$ that rise and fall in accordance to the rise and fall of the time-variant power envelopes of the amplified RF signals 16(1)-16(N) as well.

The multi-amplifier ET circuit 10 includes a common port 24 configured to receive a common low-frequency current $I_{COMMON}$ (e.g., a direct current). The regulator circuits 22(1)-22(N) may be coupled in parallel between the common port 24 and the amplifier circuits 12(1)-12(N), respectively. As previously mentioned, the currents $I_{CC1}$-$I_{CCN}$ may include both the low-frequency currents $I_{DC1}$-$I_{DCN}$ and the high-frequency currents $I_{AC1}$-$I_{ACN}$, respectively. In this regard, the regulator circuits 22(1)-22(N) are configured to receive the common low-frequency current $I_{COMMON}$ from the common port 24 and generate the low-frequency currents $I_{DC1}$-$I_{DCN}$ in the currents $I_{CC1}$-$I_{CCN}$, respectively, based on the common current $I_{COMMON}$.

In a non-limiting example, the ET voltage circuits 20(1)-20(N) can be configured to generate at least a portion of the high-frequency currents $I_{AC1}$-$I_{ACN}$ in the currents $I_{CC1}$-$I_{CCN}$, respectively. Similar to the ET voltages $V_{CC1}$-$V_{CCN}$, the currents $I_{CC1}$-$I_{CCN}$ may need to rise and fall in accordance to the rises and falls of the time-variant power envelopes of the amplified RF signals 16(1)-16(N). In this regard, the regulator circuits 22(1)-22(N) may be configured to adjust the common low-frequency current $I_{COMMON}$ to increase or decrease the low-frequency currents $I_{DC1}$-$I_{DCN}$, respectively. Likewise, the ET voltage circuits 20(1)-20(N) may be configured to source the high-frequency currents $I_{AC1}$-$I_{ACN}$ (e.g., when the time-variant power envelope transitions from average to peak) or sink the high-frequency currents $I_{AC1}$-$I_{ACN}$ (e.g., when the time-variant power envelope transitions from peak to average). Collectively, the ET voltage circuits 20(1)-20(N) and the regulator circuits 22(1)-22(N) can cause the currents $I_{CC1}$-$I_{CCN}$ to rise and fall in accordance to the rise and fall of the time-variant power envelopes of the amplified RF signals 16(1)-16(N).

The ET voltage circuits 20(1)-20(N) can be configured to generate a plurality of sense current signals 26(1)-26(N), respectively. The sense current signals 26(1)-26(N) may be configured to indicate the high-frequency currents $I_{AC1}$-$I_{ACN}$ that are sourced or sank by the ET voltage circuits 20(1)-20(N), respectively. In a non-limiting example, the regulator circuits 22(1)-22(N) can be configured to adjust the common low-frequency current $I_{COMMON}$ to generate the low-frequency currents $I_{DC1}$-$I_{DCN}$ based on the sense current signals 26(1)-26(N), respectively.

Figure 2:
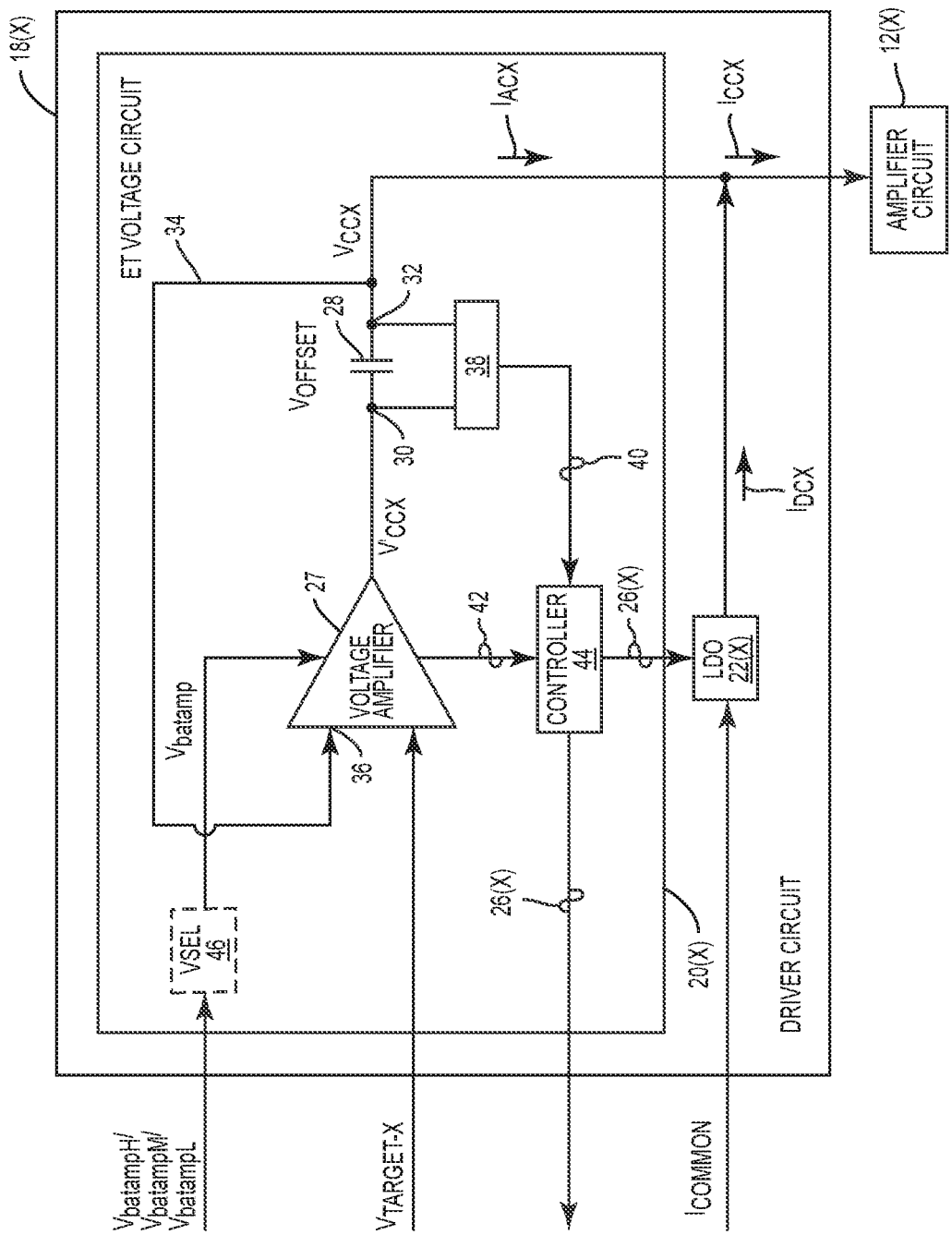
FIG. 2 is a schematic diagram of an exemplary driver circuit, which can be co-located with the amplifier circuits in the multi-amplifier ET circuit of FIG. 1.

Each of the ET voltage circuits 20(1)-20(N) can be configured to include a voltage amplifier for generating the ET voltages $V_{CC1}$-$V_{CCN}$. In this regard, FIG. 2 is a schematic diagram of an exemplary driver circuit 18(X), which can be provided in the multi-amplifier ET circuit 10 of FIG. 1 as any of the driver circuits 18(1)-18(N). Common elements between FIGS. 1 and 2 are shown therein with common element numbers and will not be re-described herein.

The driver circuit 18(X) includes an ET voltage circuit 20(X) and a regulator circuit 22(X) that are coupled to an amplifier circuit 12(X). Notably, the ET voltage circuit 20(X) is among the ET voltage circuits 20(1)-20(N) in FIG. 1, the regulator circuit 22(X) is among the regulator circuits 22(1)-22(N) in FIG. 1, and the amplifier circuit 12(X) is among the amplifier circuits 12(1)-12(N) in FIG. 1.

The ET voltage circuit 20(X) includes a voltage amplifier 27 configured to generate an initial ET voltage $V'_{CCX}$ based on an ET target voltage $V_{TARGET\text{-}X}$. Notably, the ET target voltage $V_{TARGET\text{-}X}$ is among the ET target voltages $V_{TARGET\text{-}1}$-$V_{TARGET\text{-}N}$ in FIG. 1. The ET voltage circuit 20(X) may include an offset capacitor 28 having a first end 30 coupled to the voltage amplifier 27 and a second end 32 coupled to the amplifier circuit 12(X). The offset capacitor 28 is configured to raise the initial ET voltage $V'_{CCX}$ by a predetermined offset voltage $V_{OFFSET}$ (e.g., 0.8 V) to generate an ET voltage $V_{CCX}$ ($V_{CC\text{-}X} = V'_{CCX} + V_{OFFSET}$). Notably, the ET voltage $V_{CCX}$ is among the ET voltages $V_{CC1}$-$V_{CCN}$ in FIG. 1. The ET voltage circuit 20(X) may include a feedback loop 34 coupled from the second end 32 to a feedback end 36 of the voltage amplifier 27. The feedback loop 34 is configured to provide a sample of the ET voltage $V_{CCX}$ back to the voltage amplifier 27.

The voltage amplifier 27 may be configured to source or sink a high-frequency current $I_{ACX}$, which is among the high-frequency currents $I_{AC1}$-$I_{ACN}$ in FIG. 1. In this regard, the ET voltage circuit 20(X) is configured to generate a sense current signal 26(X) to indicate the high-frequency current $I_{ACX}$ that is sourced or sank by the voltage amplifier 27. Notably, the sense current signal 26(X) is among the sense current signals 26(1)-26(N) in FIG. 1. In this regard, the regulator circuit 22(X) may be configured to adjust the common low-frequency current $I_{COMMON}$ to generate the low-frequency current $I_{DCX}$ based on the sense current signal 26(X).

In a non-limiting example, the ET voltage circuit 20(X) includes circuitry 38 coupled in parallel to the offset capacitor 28 between the first end 30 and the second end 32. The circuitry 38 may be configured to generate a voltage indicator 40 indicative of a voltage differential between the initial ET voltage $V'_{CCX}$ and the ET voltage $V_{CCX}$. The voltage amplifier 27 may be configured to generate a current indicator 42 indicative of the high-frequency current $I_{ACX}$ sourced or sank by the voltage amplifier 27. Accordingly, a controller 44 can be configured to generate the sense current signal 26(X) based on the voltage indicator 40 and the current indicator 42.

The ET voltage circuit 20(X) may receive one or more supply voltages $V_{batampH}$ (referred to as "high supply voltage"), $V_{batampM}$ (referred to as "medium supply voltage"), and $V_{batampL}$ (referred to as "low supply voltage") ($V_{batampH} > V_{batampM} > V_{batampL}$). The ET voltage circuit 20(X) may include a supply voltage selector 46 (denoted as "VSEL") configured to determine a selected supply voltage $V_{batamp}$ among the supply voltages $V_{batampH}$, $V_{batampM}$, and $V_{batampL}$ and provide the selected supply voltage $V_{batamp}$ to the voltage amplifier 27. Accordingly, the voltage amplifier 27 may generate the ET voltage $V_{CCX}$ based on the selected supply voltage $V_{batamp}$ and the ET target voltage $V_{TARGET\text{-}X}$.

With reference back to FIG. 1, the multi-amplifier ET circuit 10 may be provided in an ET amplifier apparatus 48 that further includes a tracker circuit 50. In a non-limiting example, the tracker circuit 50 is coupled to the multi-amplifier ET circuit 10 over a longer conductive length L, which may correspond to a trace inductance higher than 0.4 nH. The tracker circuit 50 may include a multi-level charge pump (MCP) 52. The MCP 52 is configured to generate a direct current voltage $V_{DC}$ based on a battery voltage $V_{BAT}$. In a non-limiting example, the MCP 52 can be configured to generate the direct current voltage VDC at 0V, $V_{BAT}$, or $2 \times V_{BAT}$. The MCP 52 is coupled in series to an inductor 54, which is configured to induce the common low-frequency current $I_{COMMON}$ based on the direct current voltage $V_{DC}$ and provide the common low-frequency current $I_{COMMON}$ to the common port 24.

The tracker circuit 50 may include a voltage amplifier circuit 56 coupled to the common port 24. The voltage amplifier circuit 56 may be configured to generate a common modulated voltage $V_{COMMON}$ and provide the common modulated voltage $V_{COMMON}$ to the common port 24. The common modulated voltage $V_{COMMON}$ is configured to make sure that the common low-frequency current $I_{COMMON}$ always flow from the common port 24 toward the amplifier circuits 12(1)-12(N). Notably, the ET voltage circuits 20(1)-20(N) may generate the ET voltages $V_{CC1}$-$V_{CCN}$ that rise and fall in accordance to the rise and fall of the time-variant power envelopes of the amplified RF signals 16(1)-16(N). In this regard, to ensure that the common low-frequency current $I_{COMMON}$ always flows from the common port 24 toward the amplifier circuits 12(1)-12(N), the common modulated voltage $V_{COMMON}$ needs to be greater than or equal to a highest ET voltage among the ET voltages $V_{CC1}$-$V_{CCN}$.

In this regard, the voltage amplifier circuit 56 may include a common voltage amplifier 58 configured to generate an initial common modulated voltage $V_{COMMON}$ based on a common ET target voltage $V_{TARGET\text{-}COMMON}$. The common voltage amplifier 58 may be coupled in series to a common offset capacitor 60, which may be configured to raise the initial common modulated voltage $V'_{COMMON}$ by a common offset voltage $V_{OFFSET\text{-}COMMON}$ to generate the common modulated voltage $V_{COMMON}$ ($V_{COMMON} = V'_{COMMON} + V_{OFFSET\text{-}COMMON}$). In a non-limiting example, the common offset voltage $V_{OFFSET\text{-}COMMON}$ can be configured to be greater than or equal to the offset voltage $V_{OFFSET}$.

The tracker circuit 50 may include a target voltage circuit 62. The target voltage circuit 62 is configured to generate the ET target voltages $V_{TARGET\text{-}1}$-$V_{TARGET\text{-}N}$ based on a target voltage signal 64. In a non-limiting example, the target voltage signal 64 is generated based on a time-variant amplitude envelope of the RF signal 14 and a target voltage look-up table (LUT) (not shown). The target voltage circuit 62 may be configured to provide the ET target voltages $V_{TARGET\text{-}1}$-$V_{TARGET\text{-}N}$ to the ET voltage circuits 20(1)-20(N), respectively. Please refer to U.S. patent application Ser. No. 16/250,229, filed on Jan. 17, 2019, and U.S. patent application Ser. No. 16/250,298, filed on Jan. 17, 2019, for an exemplary implementation of the target voltage circuit 62. The target voltage circuit 62 may be further configured to determine a maximum ET target voltage $V_{TARGET\text{-}MAX}$ among the ET target voltages $V_{TARGET\text{-}1}$-$V_{TARGET\text{-}N}$ and provide the maximum ET target voltage $V_{TARGET\text{-}MAX}$ to the common voltage amplifier 58 as the common ET target voltage $V_{TARGET\text{-}COMMON}$.

The tracker circuit 50 may further include a supply voltage circuit 66. The supply voltage circuit 66 may be configured to generate and provide the supply voltages $V_{batampH}$, $V_{batampM}$, and $V_{batampL}$ to the ET voltage circuits 20(1)-20(N).

Although the multi-amplifier ET circuit 10 is configured to enable the amplifier circuits 12(1)-12(N) to amplify concurrently the RF signal 14 for transmission in the formed RF beam(s), it may also be possible to configure the multi-amplifier ET circuit 10 to operate in a single amplifier mode. In the single amplifier mode, a selected amplifier circuit, for example the amplifier circuit 12(1), among the amplifier circuits 12(1)-12(N) for amplifying the RF signal 14 is activated, while the rest of the amplifier circuits 12(2)-12(N) are deactivated. Accordingly, a selected driver circuit, for example the driver circuit 20(1) is configured to provide a selected ET voltage (e.g., $V_{CC1}$) to the selected amplifier circuit. In this regard, it may be possible to bypass the regulator circuit 22(1) to allow the common low-frequency current $I_{COMMON}$ to flow directly from the common port 24 toward the selected amplifier circuit 12(1). This may be achieved by closing a switch 68 coupled in parallel to the regulator circuit 22(1). Notably, it may also be possible to provide the switch 68 inside the regulator circuit 22(1).

Figure 3:
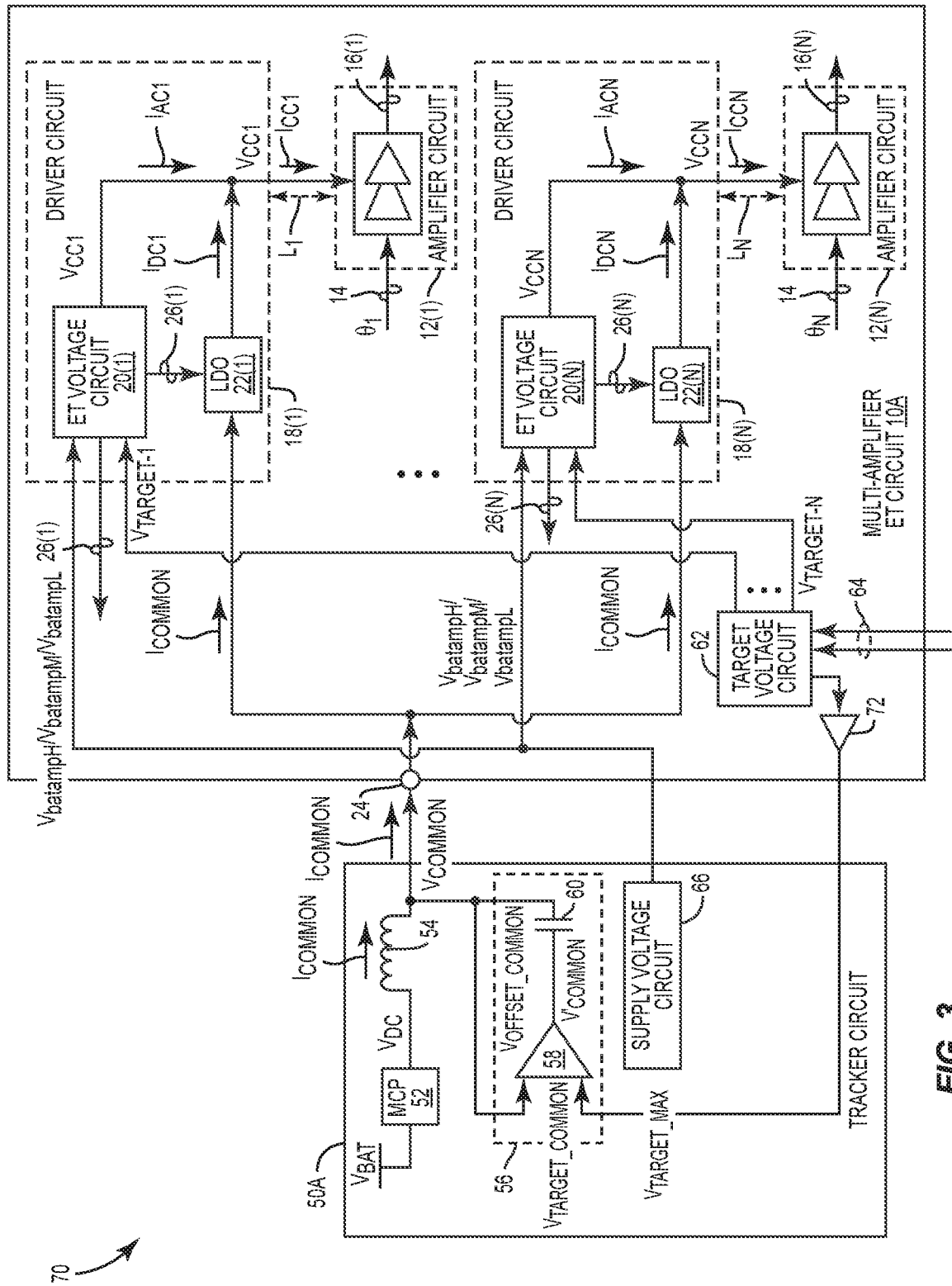
FIG. 3 is a schematic diagram of an exemplary ET amplifier apparatus configured according an embodiment of the present disclosure.

Alternative to providing the target voltage circuit 62 in the tracker circuit 50, it may also be possible to include the target voltage circuit 62 in the multi-amplifier ET circuit 10. In this regard, FIG. 3 is a schematic diagram of an exemplary ET amplifier apparatus 70 configured according to an embodiment of the present disclosure. Common elements between FIGS. 1 and 3 are shown therein with common element numbers and will not be re-described herein.

The ET amplifier apparatus 70 includes a tracker circuit 50A and a multi-amplifier ET circuit 10A. In contrast to the ET amplifier apparatus 48 of FIG. 1, in which the target voltage circuit 62 is provided in the tracker circuit 50, the target voltage circuit 62 is moved from the tracker circuit 50A into the multi-amplifier ET circuit 10A. In this regard, the target voltage circuit 62 is configured to provide the maximum ET target voltage $V_{TARGET-MAX}$ to the common voltage amplifier 58. The multi-amplifier ET circuit 10A may include a voltage driver 72 configured to boost the maximum ET target voltage $V_{TARGET-MAX}$.

Figure 4:
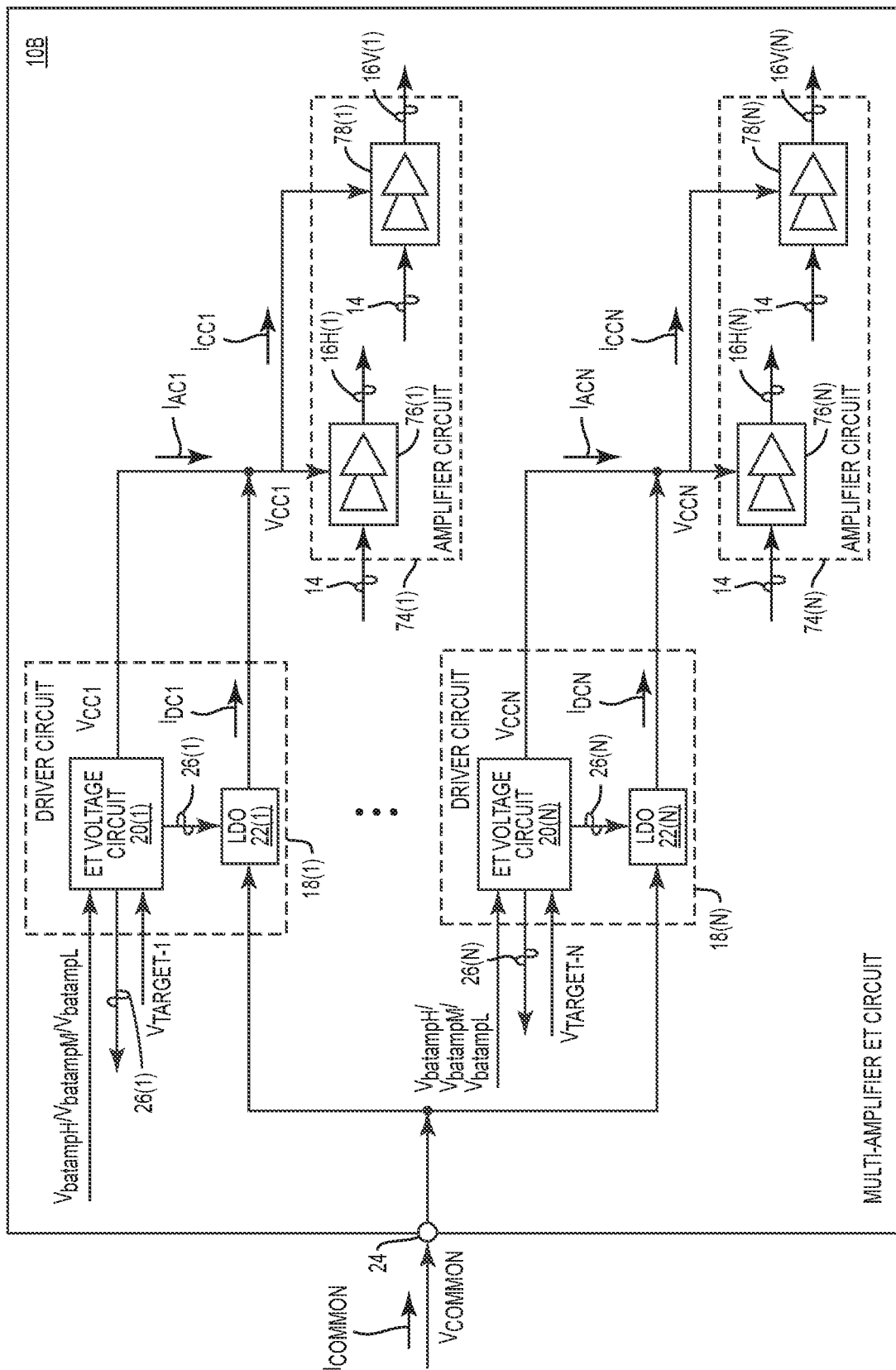
FIG. 4 is a schematic diagram of an exemplary multi-amplifier ET circuit configured according an embodiment of the present disclosure to amplify concurrently the RF signal of FIG. 1 to generate a number of amplified RF signals in different polarizations.

FIG. 4 is a schematic diagram of an exemplary multi-amplifier ET circuit 10B configured according to an embodiment of the present disclosure to amplify concurrently the RF signal 14 of FIG. 1 to generate a number of horizontally-polarized RF signals 16H(1)-16H(N) and a number of vertically-polarized RF signals 16V(1)-16V(N). Common elements between FIGS. 1 and 4 are shown therein with common element numbers and will not be re-described herein. Herein, a horizontal polarization may be parallel to earth's horizon and a vertical polarization may be perpendicular to earth's horizon.

The multi-amplifier ET circuit 10B includes a plurality of amplifier circuits 74(1)-74(N). The amplifier circuits 74(1)-74(N) include a plurality of first amplifier circuits 76(1)-76(N) and a plurality of second amplifier circuits 78(1)-78(N), respectively. The first amplifier circuits 76(1)-76(N) are configured to amplify concurrently the RF signal 14 to generate the horizontally-polarized RF signals 16H(1)-16H(N) based on the ET voltages $V_{CC1}$-$V_{CCN}$ and the currents $I_{CC1}$-$I_{CCN}$, respectively. The second amplifier circuits 78(1)-78(N) are configured to amplify concurrently the RF signal 14 to generate the vertically-polarized RF signals 16V(1)-16V(N) based on the ET voltages $V_{CC1}$-$V_{CCN}$ and the currents $I_{CC1}$-$I_{CCN}$, respectively.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) amplifier apparatus comprising:
   a multi-amplifier ET circuit comprising:
      a plurality of amplifier circuits configured to amplify concurrently a radio frequency (RF) signal for concurrent transmission based on a plurality of ET voltages and a plurality of low-frequency currents, respectively;
      a common port configured to receive a common low-frequency current; and
      a plurality of driver circuits coupled in parallel between the common port and the plurality of amplifier circuits, the plurality of driver circuits configured to:
         receive the common low-frequency current from the common port;
         receive a plurality of ET target voltages, respectively;
         generate the plurality of ET voltages based on the plurality of ET target voltages, respectively; and
         generate the plurality of low-frequency currents, respectively, based on the common low-frequency current; and
   an ET tracker circuit configured to provide the common low-frequency current and a common modulated voltage that equals a maximum of the plurality of ET target voltages to the common port.

2. The ET amplifier apparatus of claim 1 wherein the ET tracker circuit comprises:
   a multi-level charge pump (MCP) configured to generate a direct current voltage based on a battery voltage; and
   an inductor coupled in series to the MCP and configured to induce the common low-frequency current based on the direct current voltage.

3. The ET amplifier apparatus of claim 2 wherein the ET tracker circuit further comprises a voltage amplifier circuit configured to:
   generate the common modulated voltage based on a common ET target voltage; and
   provide the common modulated voltage to the common port to cause the common low-frequency current to flow from the common port toward the plurality of amplifier circuits.

4. The ET amplifier apparatus of claim 3 wherein the ET tracker circuit further comprises a target voltage circuit configured to:
   generate the plurality of ET target voltages and provide the plurality of ET target voltages to the plurality of driver circuits, respectively;
   determine a maximum ET target voltage among the plurality of ET target voltages; and
   provide the maximum ET target voltage to the voltage amplifier circuit as the common ET target voltage.

5. The ET amplifier apparatus of claim 3 wherein the multi-amplifier ET circuit further comprises a target voltage circuit configured to:
   generate the plurality of ET target voltages based on a target voltage signal;
   provide the plurality of ET target voltages to the plurality of driver circuits, respectively;
   determine a maximum ET target voltage among the plurality of ET target voltages; and
   provide the maximum ET target voltage to the voltage amplifier circuit as the common ET target voltage.

6. The ET amplifier apparatus of claim 3 wherein the ET tracker circuit further comprises a supply voltage circuit configured to generate and provide one or more supply voltages to each of the plurality of driver circuits in the multi-amplifier ET circuit.

7. The ET amplifier apparatus of claim 6 wherein the one or more supply voltages are selected from the group consisting of: a high supply voltage, a medium supply voltage lower than the high supply voltage, and a low supply voltage lower than the medium supply voltage.

8. The ET amplifier apparatus of claim 6 wherein the plurality of driver circuits comprises:
a plurality of ET voltage circuits configured to:
receive the plurality of ET target voltages, respectively; and
generate the plurality of ET voltages based on the plurality of ET target voltages, respectively; and
a plurality of regulator circuits configured to:
receive the common low-frequency current from the common port; and
adjust the common low-frequency current to generate the plurality of low-frequency currents, respectively.

9. The ET amplifier apparatus of claim 8 wherein the plurality of ET voltage circuits comprises:
a plurality of voltage amplifiers configured to generate a plurality of initial ET voltages based on the plurality of ET target voltages, respectively; and
a plurality of offset capacitors coupled in series to the plurality of voltage amplifiers and configured to raise the plurality of initial ET voltages to the plurality of ET voltages, respectively.

10. The ET amplifier apparatus of claim 9 wherein each of the plurality of voltage amplifiers is further configured to generate a respective initial ET voltage among the plurality of initial ET voltages based on a selected supply voltage among the one or more supply voltages.

11. The ET amplifier apparatus of claim 9 wherein:
the plurality of amplifier circuits is further configured to amplify concurrently the RF signal based on a plurality of high-frequency currents, respectively; and
the plurality of voltage amplifiers is further configured to source or sink at least a portion of the plurality of high-frequency currents, respectively.

12. The ET amplifier apparatus of claim 11 wherein the plurality of voltage amplifiers is further configured to generate a plurality of sense current signals indicative of the plurality of high-frequency currents being sourced or sank by the plurality of voltage amplifiers, respectively.

13. The ET amplifier apparatus of claim 12 wherein the plurality of regulator circuits is further configured to:
receive the plurality of sense current signals from the plurality of voltage amplifiers, respectively; and
adjust the common low-frequency current to generate the plurality of low-frequency currents based on the plurality of sense current signals, respectively.

14. The ET amplifier apparatus of claim 8 wherein the multi-amplifier ET circuit is further configured to operate in a single amplifier mode wherein:
a selected amplifier circuit among the plurality of amplifier circuits is activated to amplify the RF signal based on a selected ET voltage among the plurality of ET voltages and the common low-frequency current; and
a selected driver circuit is configured to provide the selected ET voltage and the common low-frequency current to the selected amplifier circuit.

15. The ET amplifier apparatus of claim 14 wherein:
a respective ET voltage circuit in the selected driver circuit is configured to generate the selected ET voltage; and
a respective regulator circuit in the selected driver circuit is bypassed such that the common low-frequency current can flow directly from the common port to the selected amplifier circuit.

16. The ET amplifier apparatus of claim 1 wherein each of the plurality of amplifier circuits comprises a first amplifier circuit and a second amplifier circuit configured to amplify the RF signal in a horizontal polarization and a vertical polarization, respectively.

17. The ET amplifier apparatus of claim 1 wherein the plurality of driver circuits and the plurality of amplifier circuits are integrated into a semiconductor die.

18. The ET amplifier apparatus of claim 1 wherein the multi-amplifier ET circuit further comprises:
a first semiconductor die comprising the plurality of driver circuits; and
a second semiconductor die comprising the plurality of amplifier circuits.

19. The ET amplifier apparatus of claim 1 wherein each of the plurality of driver circuits is coupled to a respective amplifier circuit among the plurality of amplifier circuits over a respective conductive length having less than four-tenths (0.4) nanoHenry (nH) trace inductance.

20. The ET amplifier apparatus of claim 1 wherein the ET tracker circuit is coupled to the multi-amplifier ET circuit over a respective conductive length having more than four-tenths (0.4) nanoHenry (nH) trace inductance.

* * * * *